United States Patent
Dong (10) Patent No.: US 9,490,269 B2
(45) Date of Patent: Nov. 8, 2016

(54) DISPLAY DEVICE (71) Applicant: Shenzhen China Star Optoelectronics Technology Co., Ltd., Shenzhen (CN)

(72) Inventor: Chengcai Dong, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 14/124,143

(22) PCT Filed: Jun. 26, 2013

(86) PCT No.: PCT/CN2013/078079
§ 371 (c)(1),
(2) Date: Dec. 5, 2013

(87) PCT Pub. No.: WO2014/180041
PCT Pub. Date: Nov. 13, 2014

(65) Prior Publication Data
US 2016/0086976 A1    Mar. 24, 2016

(30) Foreign Application Priority Data
May 9, 2013    (CN) .......................... 2013 1 0167898

(51) Int. Cl.
H01L 27/12    (2006.01)
G02F 1/136    (2006.01)
H01L 29/417   (2006.01)

(52) U.S. Cl.
CPC ............. *H01L 27/124* (2013.01); *G02F 1/136* (2013.01); *H01L 27/127* (2013.01); *H01L 27/1222* (2013.01); *G02F 2001/13606* (2013.01); *G09G 2320/0223* (2013.01); *H01L 29/41733* (2013.01)

(58) Field of Classification Search
CPC ............... H01L 27/124; H01L 27/127; H01L 27/1222; G02F 1/136; G02F 1/1362; G02F 1/1368; G02F 2001/13606; G09G 2320/0223
See application file for complete search history.

(56) References Cited

U.S. PATENT DOCUMENTS

| 5,414,283 | A | * | 5/1995 | den Boer | ............. | G02F 1/1368 257/59 |
|---|---|---|---|---|---|---|
| 6,091,466 | A | | 7/2000 | Kim et al. | | |
| 2002/0135709 | A1 | | 9/2002 | Sung Chae et al. | | |
| 2012/0099041 | A1 | | 4/2012 | Xie et al. | | |
| 2014/0146259 | A1 | | 5/2014 | Dong et al. | | |

FOREIGN PATENT DOCUMENTS

| CN | 101593731 | | 12/2009 |
|---|---|---|---|
| CN | 102236222 | | 11/2011 |
| CN | 102981334 | | 3/2013 |
| CN | 102981334 | A | 3/2013 |

* cited by examiner

Primary Examiner — Nikolay Yushin
(74) Attorney, Agent, or Firm — Ladas & Parry LLP (57) ABSTRACT Disclosed are a display device and the manufacturing method thereof. In the display device, the pixel unit of the display substrate comprises: a gate line material layer, a transparent electrode layer, a semiconductor layer, and a metal layer; the semiconductor layer and the metal layer are disposed between the gate line material layer and the transparent electrode layer; the metal layer is located above the semiconductor layer. The present invention could cause the storage capacitor of the display device to be smaller, thereby reducing the RC delay of the scanning signal of the gate line.

19 Claims, 5 Drawing Sheets

DISPLAY DEVICE

CROSS-REFERENCE TO RELATED APPLICATIONS

This application represents a National Stage application of PCT/CN2013/078079 entitled "Display Device and Manufacturing Method Thereof" filed Jun. 26, 2013, pending.

FIELD OF THE INVENTION

The present invention relates to the field of display technology, in particular to a display device and the manufacturing method thereof.

BACKGROUND OF THE INVENTION

In the traditional pixel unit of a display device, the gate line and the transparent electrode (ITO) located thereon form a storage capacitor (Cst). The storage capacitor can be used to improve the aperture ratio of the display device.

However, the storage capacitor will become a capacitive load of the gate line that will increase the Resistance-Capacitance Delay (RC delay) of the scanning signal of the gate line.

In order to reduce the RC delay, the storage capacitance needs to be decreased. A technological solution for decreasing the storage capacitance is to reduce the effective area of the gate line and the transparent electrode (the overlapping portion of the gate line and the transparent electrode).

In carrying out the process, the inventor finds that the prior art at least has the following problems:

In the process, the change of the effective area of the storage capacitor has higher requirements. The problems of the position not being exposed (the exposure position changed) or the lack of etch uniformity will result in failure to achieve accurately changing the effective area of the storage capacitor.

Therefore, the technological solution for decreasing the effective area of the storage capacitor can't effectively achieve the technical effect of decreasing the storage capacitance.

It is therefore necessary to provide a new technological solution to solve the above technical problems.

SUMMARY OF THE INVENTION

The object of the present invention is to provide a display device that could cause the storage capacitor formed from the gate line material layer and the transparent electrode layer of the display device to be smaller, thereby reducing the RC delay of the scanning signal of the gate line.

To solve the above problems, the present invention adopts the technological solution as follows:

A display device, the display device comprises: a display substrate including a plurality of pixel units; wherein the pixel units include a thin film transistor, the pixel units further include: a gate line material layer; a transparent electrode layer, provided on the upper portion of the positive direction of the normal on the gate line material layer, and the transparent electrode layer and the gate line material layer have an overlapping portion in the positive direction of the normal; a semiconductor layer; and a metal layer; the semiconductor layer and the metal layer are disposed between the gate line material layer and the transparent electrode layer; in the positive direction of the normal, the semiconductor layer and the metal layer are partially or entirely located on the overlapping portion; the metal layer is located above the semiconductor layer in the positive direction of the normal; the semiconductor layer and the channel layer of the thin film transistor belong to the same layer; the metal layer and the source/drain metal layer of the thin film transistor belong to the same layer; a first insulation layer is sandwiched between the gate line material layer and the semiconductor layer, and a second insulation layer is sandwiched between the metal layer and the transparent electrode layer.

In the above-described display device, the distance between the gate line material layer and the transparent electrode layer is 1.01 times to 10 times that of the thickness of the metal layer.

In the above-described display device, the distance between the gate line material layer and the transparent electrode layer is 1.01 times to 2 times that of the thickness of the metal layer.

In the above-described display device, the distance between the gate line material layer and the transparent electrode layer is 1.01 times to 1.5 times that of the thickness of the metal layer.

In the above-described display device, the semiconductor layer is an amorphous silicon layer.

Another object of the present invention is to provide a display device that could cause the storage capacitor formed from gate line material layer and the transparent electrode layer of the display device to be smaller, thereby reducing the RC delay of the scanning signal of the gate line.

To solve the above problems, the present invention adopts the technological solution as follows:

A display device, the display device comprises: a display substrate including a plurality of pixel units; wherein the pixel units include a thin film transistor, the pixel units further include: a gate line material layer; a transparent electrode layer, provided on the upper portion of the positive direction of the normal on the gate line material layer, and the transparent electrode layer and the gate line material layer have an overlapping portion in the positive direction of the normal; a semiconductor layer; and a metal layer; the semiconductor layer and the metal layer are disposed between the gate line material layer and the transparent electrode layer; in the positive direction of the normal, the semiconductor layer and the metal layer are partially or entirely located on the overlapping portion; and the metal layer is located above the semiconductor layer in the positive direction of the normal.

In the above-described display device, the semiconductor layer and the channel layer of the thin film transistor belong to the same layer; the metal layer and the source/drain metal layer of the thin film transistor belong to the same layer.

In the above-described display device, a first insulation layer is sandwiched between the gate line material layer and the semiconductor layer, a second insulation layer is sandwiched between the metal layer and the transparent electrode layer.

In the above-described display device, the distance between the gate line material layer and the transparent electrode layer is 1.01 times to 10 times that of the thickness of the metal layer.

In the above-described display device, the distance between the gate line material layer and the transparent electrode layer is 1.01 times to 2 times that of the thickness of the metal layer.

In the above-described display device, the distance between the gate line material layer and the transparent electrode layer is 1.01 times to 1.5 times that of the thickness of the metal layer.

In the above-described display device, the semiconductor layer is an amorphous silicon layer.

Another object of the present invention is to provide a display device manufacturing method that could cause the storage capacitor formed from the gate line material layer and the transparent electrode layer of the display device to be smaller, thereby reducing the RC delay of the scanning signal of the gate line.

A display device manufacturing method, the method comprises the following steps: forming a gate line material layer on a display substrate of the display device; in accordance with the order, a semiconductor layer and a metal layer are formed on the surface of a positive direction of the normal of the gate line material layer; along the positive direction of the normal, forming a transparent electrode layer on the upper surface of the metal layer, the transparent electrode layer and the gate line material layer having an overlapping portion in the positive direction of the normal; the semiconductor layer and the metal layer are disposed between the gate line material layer and the transparent electrode layer, and in the positive direction of the normal, the semiconductor layer and the metal layer are partially or entirely located on the overlapping portion, the metal layer is located above the semiconductor layer in the positive direction of the normal.

In the above-described display device manufacturing method, the semiconductor layer and the channel layer in the thin film transistor of the display substrate belong to the same layer; the metal layer and the source/drain metal layer of the thin film transistor belong to the same layer.

In the above-described display device manufacturing method, a first insulation layer is further included between the gate line material layer and the semiconductor layer, and a second insulation layer is further included between the metal layer and the transparent electrode layer. The method further comprises the following steps: after forming the gate line material layer, the first insulation layer is formed on the surface of the positive direction of the normal of the gate line material layer; along the positive direction of the normal, the second insulation layer is formed on the upper surface of the metal layer; in the method, forming the transparent electrode layer on the upper surface of the metal layer comprises the following step: along the positive direction of the normal, the transparent electrode layer is formed on the upper surface of the second insulation layer.

In the above-described display device manufacturing method, the distance between the gate line material layer and the transparent electrode layer is 1.01 times to 10 times that of the thickness of the metal layer.

In the above-described display device manufacturing method, the distance between the gate line material layer and the transparent electrode layer is 1.01 times to 2 times that of the thickness of the metal layer.

In the above-described display device manufacturing method, the distance between the gate line material layer and the transparent electrode layer is 1.01 times to 1.5 times that of the thickness of the metal layer.

In the above-described display device manufacturing method, the semiconductor layer is an amorphous silicon layer.

Compared with the prior art, the present invention is provided with a semiconductor layer and a metal layer between the gate line material layer and transparent electrode layer. Thus, the distance of between gate line material layer and transparent electrode layer is increased, thereby to decreasing the storage capacitor, which is formed from the gate line material layer and the transparent electrode layer.

In order to make the present invention more clear, preferred embodiments, and the drawings thereof, are described in detail below.

DETAILED DESCRIPTION OF THE INVENTION

In the following description of the embodiments, with reference to the attached drawings, the present invention can be used to illustrate specific embodiments to be implemented. The present invention mentions directional terms, such as "upper", "lower", "front" and "rear", "left", "right", "inside", "outside", "side", etc. These are only references to additional schema directions. Accordingly, the directional terms are used to describe and understand the present invention and are not intended to limit the present invention.

The display device of the present invention may be either LCD (Liquid Crystal Display), or may be OLED (Organic Light-Emitting Diode). When using LCD, for example, the display device of the present invention can comprise a display panel, a backlight module, a scan driver circuit, a data driver circuit, a clock signal generation circuit, power, etc., wherein the display panel comprises a thin film transistor array substrate, a color filter substrate, a liquid crystal layer, a first polarizer, a second polarizer, etc. The color filter substrate is provided above the thin film transistor array substrate, the liquid crystal layer is disposed between the color filter substrate and the thin film transistor array substrate, and the first polarizer and the second polarizer are respectively disposed on a light-entering side and a light-emitting side of the display panel. The thin film transistor array substrate comprises a plurality of pixel units, a plurality of gate lines (scan lines), a plurality of data lines, a plurality of thin film transistors, a plurality of pixel electrodes (transparent electrodes), the three-stage of the thin film transistor (transistor) connects with a gate line, a data line, and a pixel electrode. The pixel electrodes are for controlling the turning of liquid crystal molecules in the liquid crystal layer by changing the electric field. In the other types of display devices, the color filter substrate and the thin film transistor substrate may also be disposed on the same display substrate.

Figure 1A:
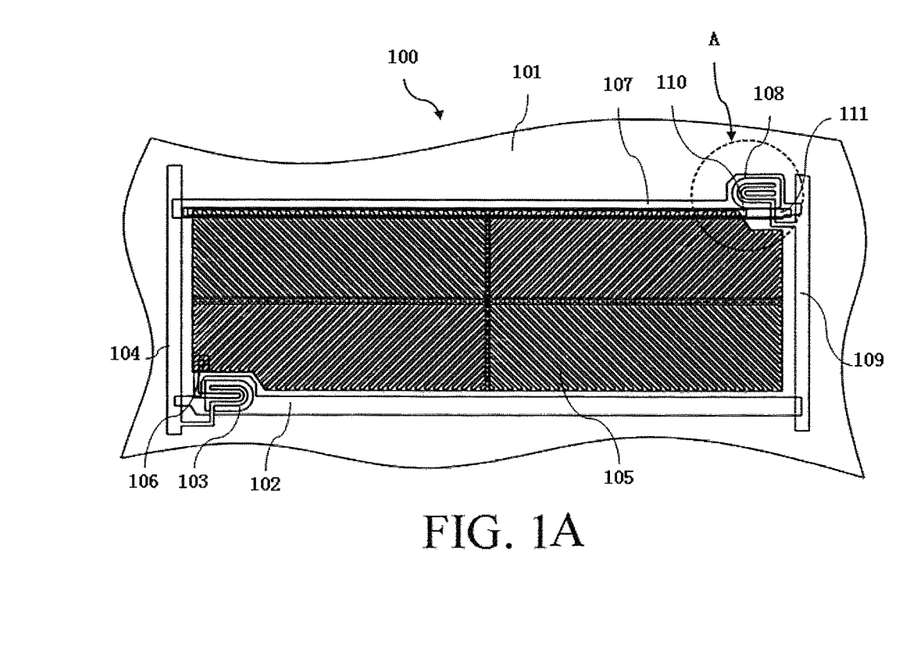
FIG. 1A is a schematic view of a first embodiment of a display device of the present invention.
Figure 1B:
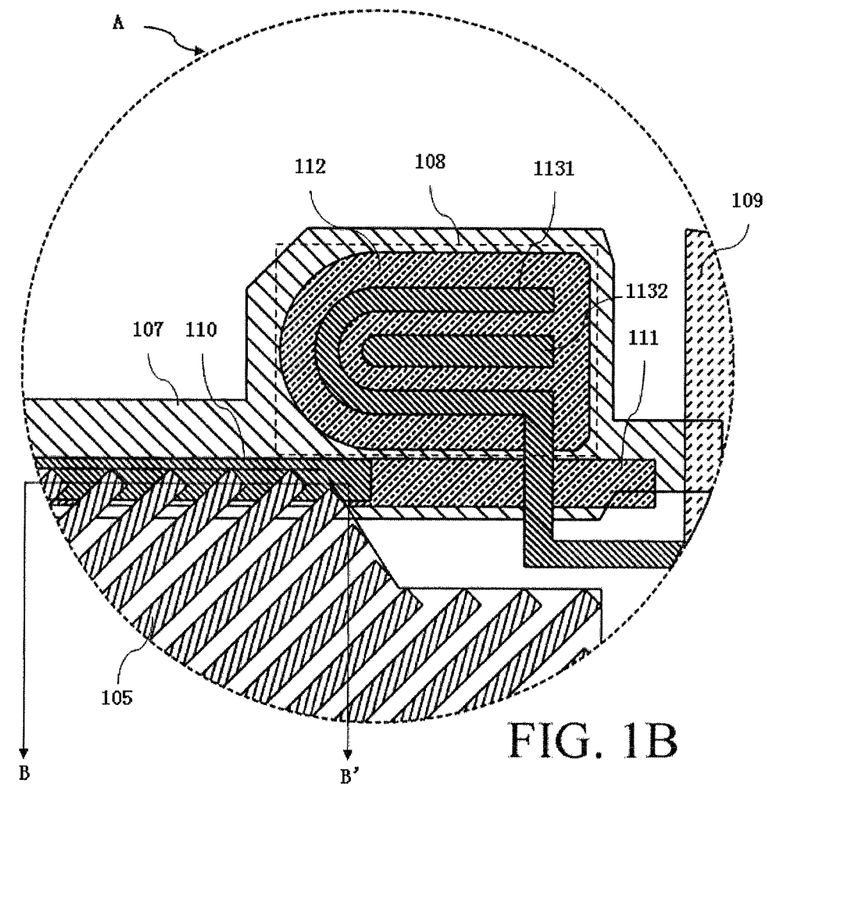
FIG. 1B is a partial view of the region A in FIG. 1A.
Figure 2:
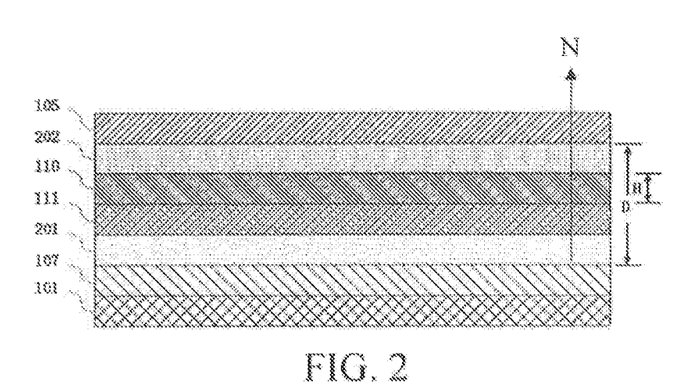
FIG. 2 is a schematic sectional view of B-B' in FIG. 1B.

Please refer to FIG. 1A, FIG. 1B, and FIG. 2. FIG. 1A is a schematic diagram of the first embodiment of a display device of the present invention. FIG. 1B is a partial view of the region A in FIG. 1A. FIG. 2 is a schematic sectional view of B-B' in FIG. 1B.

The display device 100, as shown in FIG. 1A, only illustrates a first sub-pixel of the pixel units. The first sub-pixel is disposed on a substrate 101 (glass substrate or plastic substrate), the first sub-pixel includes a first gate line (a first scan line) 102, a first thin film transistor 103, a first data line 104, a first hole 106, and a transparent electrode layer (pixel electrode) 105. A second sub-pixel, which is adjoined to the first sub-pixel, includes a gate line material layer (second gate line/scan line) 107, a second thin film transistor 108, a second data line 109, a second pixel electrode (not shown in Figure), and a second hole (not shown in Figure). The storage capacitor formed from the gate line and the transparent electrode has two situations, as below: The first situation is that the storage capacitor is formed from the first gate line 102 and the transparent electrode layer 105; the second situation is that the storage capacitor is formed from the gate line material layer 107 and the transparent electrode layer 105. FIGS. 1A and 1B illustrate the second situation mentioned above. The description of the first situation can be obtained by analogy.

The display device 100 of the embodiment comprises a display substrate, wherein the display substrate includes a plurality of pixel units. Every pixel unit includes a thin film transistor (second thin film transistor 108), a data line (second data line 109), a gate line material layer (second gate line/scan line) 107, and, a pixel electrode (transparent electrode layer 105). The transparent electrode layer 105 is disposed above the positive direction of the normal N, and the transparent electrode layer 105 and the gate line material layer 107 have an overlapping portion in the positive direction of the normal N. Thus, the storage capacitor is formed from the gate line material layer 107 and the transparent electrode layer 105.

In the overlapping portion, the pixel unit of the display device 100 further comprises a semiconductor layer 111 and a metal layer 110. The semiconductor layer 111 and the metal layer 110 are disposed between the gate line material layer 107 and the transparent electrode layer 105.

In the positive direction of the normal, the semiconductor layer 111 and the metal layer 110 are partially or entirely located on the overlapping portion.

The metal layer 110 is located above the semiconductor layer 111 in the positive direction of the normal, as shown in FIG. 2.

In the present embodiment, a first insulation layer 201 is sandwiched between the gate line material layer 107 and the semiconductor layer 111. Second insulation layer 202 is sandwiched between the metal layer 110 and the transparent electrode layer 105. The forming of the first insulation layer 201 and the second insulation layer 202 can integrate to the same layer in the insulation layer process of the other components. That is, during the process of fabricating the other components of the same layer, the first insulation layer 201 and the second insulation layer 202 are formed on the part of storage capacitor.

In the present embodiment, the gate line material layer 107, the semiconductor layer 111, the metal layer 110, and the transparent electrode layer 105 are disposed on the positive direction of the normal in order. The gate line material layer 107 and the semiconductor layer 111 constitute a capacitor. The semiconductor layer 111 and the metal layer 110 constitute another capacitor. The metal layer 110 and transparent electrode layer 105 constitute the third capacitor. These three capacitors are a series. This series of capacitors will decrease the total capacitance, resulting in the value of the storage capacitance being reduced. On the other hand, the embodiment is provided with the semiconductor layer 111 and the metal layer 110 between the gate line material layer 107 and the transparent electrode layer 105. Thus, the distance of between gate line material layer 107 and the transparent electrode layer 105 increases and the storage capacitance formed from gate line material layer 107 and the transparent electrode layer 105 decreases.

In the present embodiment, the distance between the gate line material layer 107 and the transparent electrode layer 105 is 1.01 times to 10 times that of the thickness of the metal layer 10. That is, in positive direction of the normal, the distance D between the gate line material layer 107 and the transparent electrode layer 105 is 1.01 times to 10 times that of the thickness H of the metal layer 110. That is, the ratio of distance D to thickness H is in the range of 1.01 to 10. For example, a value of the ratio may be 10, 5.287, 3.01, 1.15, 1.01, etc. The smaller the value of the ratio, the smaller the value of the storage capacitance formed from the gate line material layer 107 and the transparent electrode layer 105 is. The reason is, on the one hand, the thickness of the metal layer 110 increases, which increases the distance D between gate line material layer 107 and transparent electrode layer 105 so as to decrease the storage capacitance. On the other hand, as opposed to insulation materials (the dielectric constant of silicon nitride (insulation layer) is about 7), the metal properties of the metal layer 110 makes the storage capacitance decrease.

In the present embodiment, the semiconductor layer 111 and the channel layer 112 in the thin film transistor (second thin film transistor 108) belong to the same layer; the metal layer 110 and the source 1131/drain 1132 metal layer in the thin film transistor (second thin film transistor 108) belong to the same layer. The material of the semiconductor layer 111 may be the same as the channel layer 112. In the process, the semiconductor layer 111 and the channel layer 112 may be formed in the same procedure. Similarly, the metal layer 110 may use the same material as the source/drain metal layer 1131 and 1132, the metal layer 110 and the source/drain metal layer 1131 and 1132 may be formed in same procedure. Accordingly, this simplifies the process.

Furthermore, in the present embodiment, due to the fact that the gate line material layer 107 and the transparent electrode layer 105 are conductors, the semiconductor layer 111 and the metal layer 110 are separated by using first insulation layer 201 and the second insulation layer 202, which prevents transparent electrode layer 105 and the metal layer 110 from being combined into a plate, and the gate line material layer 107 and the semiconductor layer 111 are combined into another plate, that is caused by the metal layer 110 and the semiconductor layer 111 coming into contact with transparent electrode layer 105 and the gate line material layer 107 respectively, thus preventing the distance between the two plates of the storage capacitor from decreasing (storage capacitance is increased).

In the second embodiment of the present invention, display device 100 is similar to the first embodiment mentioned above, with the difference: the ratio of distance D to thickness H is in the range of 1.01 to 2. For example, a value of the ratio may be 2, 1.7, 1.55, 1.32, 1.226, 1.1, 1.05, 1.01, etc.

In the third embodiment of the present invention, display device 100 is similar to the first or second embodiment mentioned above, with the difference: the ratio of distance D to thickness H is in the range of 1.01 to 1.5. For example, a value of the ratio may be 1.5, 1.4, 1.37, 1.18, 1.01, etc.

In any one of the embodiments, from the first to third, mentioned above, the semiconductor layer 111 is an amorphous silicon layer. The forming of the amorphous silicon layer can integrate to the same layer in the amorphous silicon layer process of the other components. That is, during the process of fabricating the other components of the same layer, the amorphous silicon layer is formed on the part of storage capacitor.

As an alternative, in the positive direction of the normal, the metal layer 110 is deposed below the semiconductor layer 111. A first insulation layer 201 is sandwiched between the metal layer 110 and the gate line material layer 107, a second insulation layer 202 is sandwiched between transparent electrode layer 105 and the semiconductor layer 111. That is, in the layer of semiconductor layer 111, the material of storage capacitor is semiconductor material and the material of besides the storage capacitor portion may be other materials. Similarly, in the layer of the metal layer 110, the material of storage capacitor is metal material, and the material of besides the storage capacitor portion may be other materials.

Figure 3:
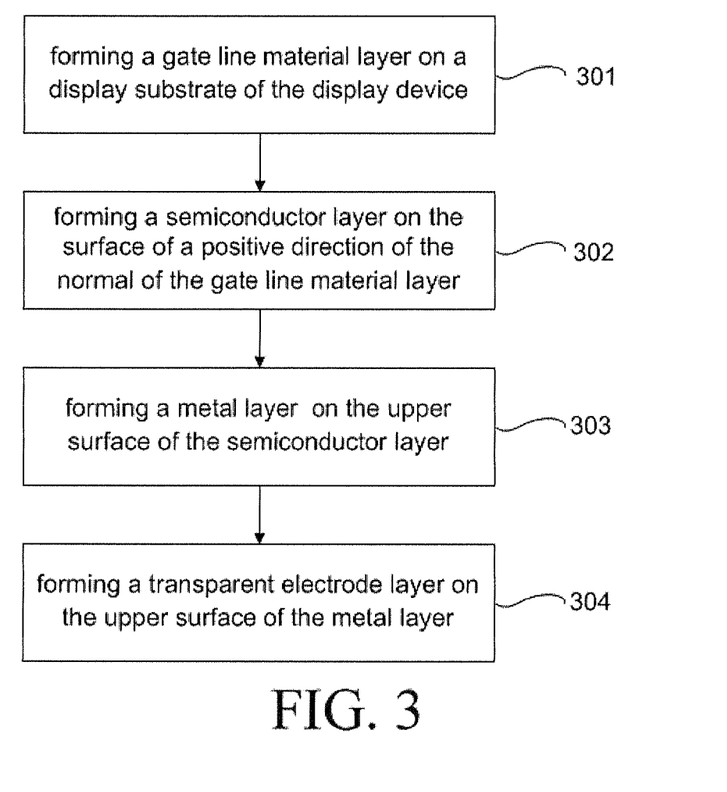
FIG. 3 is a flow chart for the present invention of the manufacturing method of a display device for the first embodiment.

Please refer to FIG. 3. FIG. 3 is a flow chart for the present invention of the manufacturing method of display device 100 in the first embodiment.

A display device 100 manufacturing method of the first embodiment, which comprises the following steps:

Step 301, forming a gate line material layer 107 on a display substrate of the display device 100.

Step 302 and Step 303, in accordance with the order, a semiconductor layer 111 and a metal layer 110 are formed on the surface of a positive direction of the normal of the gate line material layer 107. That is, in Step 301, along the positive direction of the normal, the semiconductor layer 111 is formed on the upper surface of the gate line material layer 107. In Step 302, along the positive direction of the normal, the metal layer 110 is formed on the upper surface of the semiconductor layer 111.

Step 304, along the positive direction of the normal, transparent electrode layer 105 is formed on the upper surface of the metal layer 110.

The transparent electrode layer 105 and the gate line material layer 107 have an overlapping portion in the positive direction of the normal.

The semiconductor layer 111 and the metal layer 110 are disposed between the gate line material layer 107 and the transparent electrode layer 105, and in the positive direction of the normal, the semiconductor layer 111 and the metal layer 110 are partially or entirely located on the overlapping portion. The metal layer 110 is located above the semiconductor layer 111 in the positive direction of the normal, as shown in FIG. 2.

The semiconductor layer 111 and the channel layer 112 in thin film transistor (second thin film transistor 108) of the display substrate belong to the same layer.

The metal layer 110 and the source 1131/drain 1132 metal layer of the thin film transistor (second thin film transistor 108) belong to the same layer.

Figure 4:
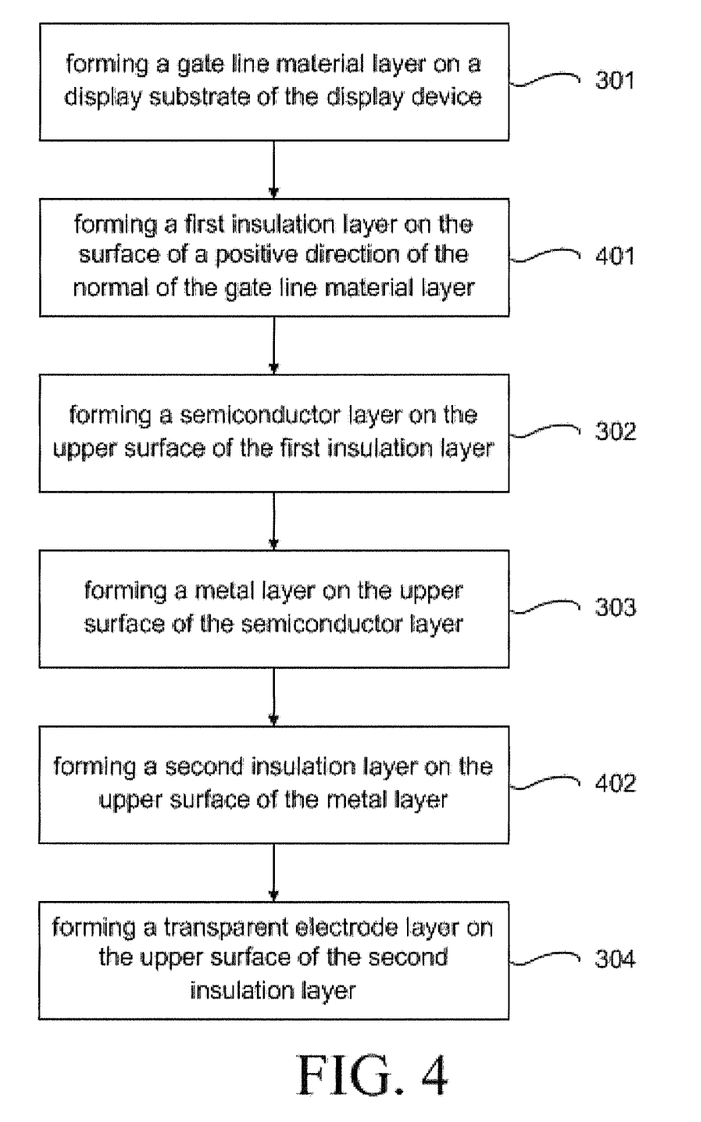
FIG. 4 is a flow chart for the present invention of the manufacturing method of a display device for the second embodiment.

FIG. 4 is a flow chart for the present invention of the manufacturing method of display device 100 in the second embodiment. The embodiment is similar to the first embodiment mentioned above, with the difference:

First insulation layer 201 is further included between gate line material layer 107 and the semiconductor layer 111. Second insulation layer 202 is further included between metal layer 110 and the transparent electrode layer 105. The method further comprises the following steps:

Step 401, after forming the gate line material layer 107 (Step 301), a first insulation layer 201 is formed on the surface of the positive direction of the normal of the gate line material layer 107.

Step 402, along the positive direction of the normal, a second insulation layer 202 is formed on the upper surface of the metal layer 110.

In the method, the step (Step 403) of forming a transparent electrode layer 105 on the upper surface of the metal layer 110 is that:

Along the positive direction of the normal, the transparent electrode layer 105 formed on the upper surface of the second insulation layer 202.

The forming of the first insulation layer 201 and the second insulation layer 202 can integrate to the same layer in the insulation layer process of the other components. That is, during the process of fabricating the other components of the same layer, the first insulation layer 201 and the second insulation layer 202 are formed on the part of storage capacitor.

In the present embodiment, the gate line material layer 107, the semiconductor layer 111, the metal layer 110, and the transparent electrode layer 105 are disposed on the positive direction of the normal in that order. The gate line material layer 107 and the semiconductor layer 111 constitute a capacitor. The semiconductor layer 111 and the metal layer 110 constitute another capacitor the metal layer 110 and the transparent electrode layer 105 constitute the third capacitor. These three capacitors are a series. The series of capacitors will decrease the total capacitance, so that result is that the value of the storage capacitance is reduced. On the other hand, due to being provided with a semiconductor layer 111 and a metal layer 110 between the gate line material layer 107 and the transparent electrode layer 105, the distance of between gate line material layer 107 and the transparent electrode layer 105 increases and the storage capacitance formed from gate line material layer 107 and transparent electrode layer 105 decreases.

In the present embodiment, the distance between the gate line material layer 107 and the transparent electrode layer 105 is 1.01 times to 10 times that of the thickness of the metal layer 10. That is, in the positive direction of the normal, the distance D between the gate line material layer 107 and the transparent electrode layer 105 is 1.01 times to 10 times that of the thickness H of the metal layer 110. That is, the ratio of distance D to thickness H is in the range of 1.01 to 10. For example, a value of the ratio may be 10, 5.287, 3.01, 1.15, 1.01, etc. The smaller the value of the ratio, the smaller the value of the storage capacitance formed from the gate line material layer 107 and the transparent electrode layer 105 is. The reason for this is, on the one hand, the increase in thickness of the metal layer 110, which increases the distance D between the gate line material layer 107 and the transparent electrode layer 105, so as to decrease the storage capacitance. On the other hand, as opposed to insulation materials (the dielectric constant of silicon nitride (insulation layer) is about 7), the metal properties of the metal layer 110 makes the storage capacitance decrease.

In the present embodiment, the semiconductor layer 111 and the channel layer 112 in the thin film transistor (second thin film transistor 108) belong to the same layer. The metal layer 110 and the source 1131/drain 1132 metal layer in the thin film transistor (second thin film transistor 108) belong to the same layer. The material of the semiconductor layer 111 may be the same as used in channel layer 112. In the process, the semiconductor layer 111 and the channel layer 112 may be formed in same procedure. Similarly, the metal layer 110 may use the same material as the source/drain metal layer 1131, 1132. The metal layer 110 and the source/drain metal layer 1131, 1132 may be formed in same procedure. Accordingly, this simplifies the process.

Furthermore, in the present embodiment, due to the fact that gate line material layer 107 and the transparent electrode layer 105 are conductors, the semiconductor layer 111 and the metal layer 110 are separated by using first insulation layer 201 and the second insulation layer 202, thereby preventing the transparent electrode layer 105 and the metal layer 110 from combining to form a plate, and the gate line material layer 107 and the semiconductor layer 111 combine with the other plate, that is formed by the metal layer 110 and semiconductor layer 111 coming into contact with transparent electrode layer 105 and gate line material layer 107 respectively, thus preventing the distance between the two plates of the storage capacitor from being decreased (storage capacitance is increased).

The third embodiment of the present invention, the manufacturing method for display device 100 is similar to the first and second embodiments mentioned above, with the difference: the ratio of distance D to thickness H is in the range of 1.01 to 2. For example, a value of the ratio may be 2, 1.7, 1.55, 1.32, 1.226, 1.1, 1.05, 1.01, etc.

The fourth embodiment of the present invention, the manufacturing method for display device 100 is similar to the first, second, or third embodiments mentioned above, with the difference: the ratio of distance D to thickness H is in the range of 1.01 to 1.5. For example, a value of the ratio may be 1.5, 1.4, 1.37, 1.18, 1.01, etc.

In any one of the first to fourth embodiments mentioned above, the semiconductor layer 111 is an amorphous silicon layer. The forming of the amorphous silicon layer can integrate to the same layer in the amorphous silicon layer process of the other components. That is, during the process of fabricating the other components of the same layer, the amorphous silicon layer is formed on part of the storage capacitor.

As an alternative, in the positive direction of the normal, the metal layer 110 is deposed below the semiconductor layer 111. A first insulation layer 201 is sandwiched between the metal layer 110 and the gate line material layer 107; a second insulation layer 202 is sandwiched between transparent electrode layer 105 and the semiconductor layer 111. That is, in the semiconductor layer 111, the material of storage capacitor is semiconductor material and the material of besides the storage capacitor portion may be other materials. Similarly, in the layer of the metal layer 110, the material of storage capacitor is metal material, and the material of besides the storage capacitor portion may be other materials.

In summary, although the present invention has been explained by the embodiments shown in the drawings described above, it should be understood to an ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A display device, comprising:
 a display substrate including a plurality of pixel units, the pixel units including a thin film transistor, and each of the pixel units further comprising:
  a gate line material layer extending from a data line to reach an adjacent data line;
  a transparent electrode layer provided on an upper of a positive direction of a normal of the gate line material layer, the transparent electrode layer and the gate line material layer having an overlapping portion in the positive direction of the normal;
  a semiconductor layer; and
  a metal layer,
 wherein the semiconductor layer and the metal layer are disposed between the gate line material layer and the transparent electrode layer;
 a side of the transparent electrode layer extending from the data line to the adjacent data line, and, in the positive direction of the normal, the side of the transparent electrode layer is located over the gate line material layer to form the overlapping portion, and the semiconductor layer and the metal layer are entirely located on the overlapping portion;
 the metal layer is located above the semiconductor layer in the positive direction of the normal;
 the semiconductor layer and a channel layer of the thin film transistor belong to the same layer;
 the metal layer and a source/drain metal layer of the thin film transistor belong to the same layer; and
 a first insulation layer is sandwiched between the gate line material layer and the semiconductor layer, a second insulation layer is sandwiched between the metal layer and the transparent electrode layer.

2. The display device as claimed in claim 1, wherein the semiconductor layer is an amorphous silicon layer.

3. The display device as claimed in claim 1, wherein a distance between the gate line material layer and the transparent electrode layer is 1.01 times to 10 times that of the thickness of the metal layer.

4. The display device as claimed in claim 3, wherein the distance between the gate line material layer and the transparent electrode layer is 1.01 times to 2 times that of the thickness of the metal layer.

5. The display device as claimed in claim 4, wherein the distance between the gate line material layer and the transparent electrode layer is 1.01 times to 1.5 times that of the thickness of the metal layer.

6. A display device, comprising:
 a display substrate including a plurality of pixel units, the pixel units including a thin film transistor, each of the pixel units further comprise:
  a gate line material layer extending from a data line to reach an adjacent data line;
  a transparent electrode layer provided on an upper of a positive direction of a normal of the gate line material layer, the transparent electrode layer and the gate line material layer having an overlapping portion in the positive direction of the normal;
  a semiconductor layer; and
  a metal layer,
 wherein the semiconductor layer and the metal layer are disposed between the gate line material layer and the transparent electrode layer;
 a side of the transparent electrode layer extending from the data line to the adjacent data line, and, in the positive direction of the normal, the side of the transparent electrode layer is located over the gate line material layer to form the overlapping portion, and the semiconductor layer and the metal layer are entirely located on the overlapping portion; and
 the metal layer is located above the semiconductor layer in the positive direction of the normal.

7. The display device as claimed in claim 6, wherein the semiconductor layer is an amorphous silicon layer.

8. The display device as claimed in claim 6, wherein the semiconductor layer and a channel layer of the thin film transistor belong to the same layer;
the metal layer and a source/drain metal layer of the thin film transistor belong to the same layer.

9. The display device as claimed in claim 8, wherein a first insulation layer is sandwiched between the gate line material layer and the semiconductor layer, and a second insulation layer is sandwiched between the metal layer and the transparent electrode layer.

10. The display device as claimed in claim 6, wherein a distance between the gate line material layer and the transparent electrode layer is 1.01 times to 10 times that of the thickness of the metal layer.

11. The display device as claimed in claim 10, wherein the distance between the gate line material layer and the transparent electrode layer is 1.01 times to 2 times that of the thickness of the metal layer.

12. The display device as claimed in claim 11, wherein the distance between the gate line material layer and the transparent electrode layer is 1.01 times to 1.5 times that of the thickness of the metal layer.

13. A display device manufacturing method, which comprises the following steps:
forming a gate line material layer on a display substrate of the display device, the gate line material layer extending from a data line to reach an adjacent data line;
in accordance with the order, forming a semiconductor layer and a metal layer on the surface of a positive direction of a normal of the gate line material layer; and
along the positive direction of the normal, forming a transparent electrode layer on an upper surface of the metal layer, the transparent electrode layer and the gate line material layer having an overlapping portion in the positive direction of the normal,
wherein the semiconductor layer and the metal layer are disposed between the gate line material layer and the transparent electrode layer, and a side of the transparent electrode layer extending from the data line to the adjacent data line, and, in the positive direction of the normal, the side of the transparent electrode layer is located over the gate line material layer to form the overlapping portion, and the semiconductor layer and the metal layer are entirely located the overlapping portion, the metal layer is located above the semiconductor layer in the positive direction of the normal.

14. The display device manufacturing method as claimed in claim 13, wherein the semiconductor layer and a channel layer of the thin film transistor belong to the same layer;
the metal layer and a source/drain metal layer of the thin film transistor belong to the same layer.

15. The display device manufacturing method as claimed in claim 13, wherein between the gate line material layer and the semiconductor layer a first insulation layer is further included, between the metal layer and transparent electrode layer a second insulation layer is further included, the method further comprises the following steps:
after forming the gate line material layer, the first insulation layer is formed on the surface of the positive direction of the normal of the gate line material layer;
along the positive direction of the normal, the second insulation layer is formed on the upper surface of the metal layer;
in the method, forming transparent electrode layer on the upper surface of the metal layer comprises the step of:
along the positive direction of the normal, the transparent electrode layer is formed on the upper surface of the second insulation layer.

16. The display device manufacturing method as claimed in claim 13, wherein the semiconductor layer is an amorphous silicon layer.

17. The display device manufacturing method as claimed in claim 13, wherein a distance between the gate line material layer and the transparent electrode layer is 1.01 times to 10 times that of the thickness of the metal layer.

18. The display device manufacturing method as claimed in claim 17, wherein the distance between the gate line material layer and the transparent electrode layer is 1.01 times to 2 times that of the thickness of the metal layer.

19. The display device manufacturing method as claimed in claim 18, wherein the distance between the gate line material layer and the transparent electrode layer is 1.01 times to 2 times that of the thickness of the metal layer.

* * * * *